(12) United States Patent
Daley

(10) Patent No.: US 7,115,532 B2
(45) Date of Patent: Oct. 3, 2006

(54) METHODS OF FORMING PATTERNED PHOTORESIST LAYERS OVER SEMICONDUCTOR SUBSTRATES

(75) Inventor: Jon P. Daley, Boise, ID (US)

(73) Assignee: Micron Technolgoy, Inc., Boise, ID (US)

( * ) Notice: Subject to any disclaimer, the term of this patent is extended or adjusted under 35 U.S.C. 154(b) by 41 days.

(21) Appl. No.: 10/655,997

(22) Filed: Sep. 5, 2003

(65) Prior Publication Data

US 2005/0054216 A1  Mar. 10, 2005

(51) Int. Cl.
  *H01L 21/47* (2006.01)
  *H01L 21/347* (2006.01)
  *G03C 5/00* (2006.01)

(52) U.S. Cl. ............ 438/780; 438/497; 438/769; 438/947; 430/313

(58) Field of Classification Search ........... 438/497, 438/765, 769, 780, 781, 942, 947, 948, 949, 438/952; 430/313, 327
See application file for complete search history.

(56) References Cited

U.S. PATENT DOCUMENTS

| | | | |
|---|---|---|---|
| 3,349,474 A | 10/1967 | Rauscher | |
| 3,772,101 A | 11/1973 | Chumbres et al. | |
| 4,086,074 A | 4/1978 | Minot et al. | |
| 4,622,735 A | 11/1986 | Shibata | |
| 4,683,645 A | 8/1987 | Naguib et al. | |
| 4,693,910 A | 9/1987 | Nakajima et al. | |
| 4,766,090 A | 8/1988 | Coquin et al. | |
| 5,099,304 A | 3/1992 | Takemura et al. | |
| 5,236,865 A | 8/1993 | Sandhu et al. | |
| 5,406,123 A | 4/1995 | Narayan | 257/767 |
| 5,444,024 A | 8/1995 | Anjum et al. | |
| 5,470,784 A | 11/1995 | Coleman | 437/101 |
| 5,470,794 A | 11/1995 | Anjum | 437/200 |
| 5,670,298 A | 9/1997 | Hur | |
| 5,677,102 A | 10/1997 | Shihara | |
| 5,904,517 A | 5/1999 | Gardner et al. | 438/197 |
| 5,955,244 A * | 9/1999 | Duval | 430/314 |
| 5,998,264 A | 12/1999 | Wu | 438/260 |
| 6,013,582 A * | 1/2000 | Ionov et al. | 438/738 |
| 6,037,239 A | 3/2000 | Jennings | |
| 6,096,621 A | 8/2000 | Jennings | |
| 6,096,634 A | 8/2000 | Nguyen | |
| 6,130,140 A | 10/2000 | Gonzalez | |
| 6,133,105 A | 10/2000 | Chen et al. | |

(Continued)

FOREIGN PATENT DOCUMENTS

EP    0 851 473 A2   1/1998

(Continued)

OTHER PUBLICATIONS

U.S. Appl. No. 10/177,056, filed Jun. 21, 2002, Tran.

(Continued)

*Primary Examiner*—Zandra V. Smith
*Assistant Examiner*—Pamela E Perkins
(74) *Attorney, Agent, or Firm*—Wells St. John P.S.

(57) ABSTRACT

This invention comprises methods of forming patterned photoresist layers over semiconductor substrates. In one implementation, a semiconductor substrate is provided. An antireflective coating is formed over the semiconductor substrate. The antireflective coating has an outer surface. The outer surface is treated with a basic fluid. A positive photoresist is applied onto the outer surface which has been treated with the basic treating fluid. The positive photoresist is patterned and developed effective to form a patterned photoresist layer having increased footing at a base region of said layer than would otherwise occur in the absence of said treating the outer surface. Other aspects and implementations are contemplated.

75 Claims, 3 Drawing Sheets

U.S. PATENT DOCUMENTS

| | | | |
|---|---|---|---|
| 6,133,116 A | 10/2000 | Kim et al. | |
| 6,156,674 A | 12/2000 | Li et al. | |
| 6,165,834 A | 12/2000 | Agarwal et al. | |
| 6,177,235 B1 | 1/2001 | Francou et al. | |
| 6,180,465 B1 | 1/2001 | Gardner et al. | 438/291 |
| 6,188,097 B1 | 2/2001 | Derderian et al. | |
| 6,207,485 B1 | 3/2001 | Gardner et al. | 438/216 |
| 6,238,994 B1 | 5/2001 | Derderian et al. | |
| 6,255,035 B1 | 7/2001 | Minter et al. | |
| 6,277,709 B1 | 8/2001 | Wang et al. | |
| 6,277,728 B1 | 8/2001 | Ahn et al. | |
| 6,281,100 B1 | 8/2001 | Yin et al. | |
| 6,291,363 B1 | 9/2001 | Yin et al. | |
| 6,297,527 B1 | 10/2001 | Agarwal et al. | |
| 6,350,560 B1 * | 2/2002 | Sahbari | 430/325 |
| 6,376,149 B1 | 4/2002 | Grober et al. | |
| 6,380,611 B1 * | 4/2002 | Yin et al. | 257/649 |
| 6,383,723 B1 | 5/2002 | Iyer et al. | |
| 6,399,982 B1 | 6/2002 | Derderian et al. | |
| 6,440,793 B1 | 8/2002 | Divakaruni et al. | |
| 6,465,325 B1 | 10/2002 | Ridley et al. | |
| 6,511,896 B1 | 1/2003 | Basceri et al. | |
| 6,548,854 B1 | 4/2003 | Kizilyalli et al. | 257/310 |
| 6,582,861 B1 * | 6/2003 | Buxbaum et al. | 430/5 |
| 6,582,888 B1 | 6/2003 | Herbst et al. | |
| 6,608,343 B1 | 8/2003 | Derderian et al. | |
| 6,613,240 B1 | 9/2003 | Skinner et al. | |
| 6,617,250 B1 | 9/2003 | Basceri et al. | |
| 6,649,466 B1 | 11/2003 | Basceri et al. | |
| 6,720,638 B1 | 4/2004 | Tran | |
| 6,744,093 B1 | 6/2004 | Agarwal et al. | |
| 6,746,916 B1 | 6/2004 | Agarwal et al. | |
| 6,753,618 B1 | 6/2004 | Basceri et al. | 257/915 |
| 6,777,739 B1 | 8/2004 | Agarwal et al. | |
| 6,780,728 B1 | 8/2004 | Tran | 438/400 |
| 6,780,766 B1 | 8/2004 | Basceri et al. | |
| 6,817,086 B1 | 11/2004 | Lu et al. | |
| 6,838,363 B1 | 1/2005 | Wieczorek et al. | |
| 6,844,131 B1 * | 1/2005 | Oberlander et al. | 430/270.1 |
| 6,900,497 B1 | 5/2005 | Agarwal et al. | |
| 6,956,980 B1 * | 10/2005 | Nagata et al. | 385/2 |
| 2001/0006759 A1 | 7/2001 | Shipley, Jr. et al. | |
| 2002/0076879 A1 | 6/2002 | Lee et al. | |
| 2002/0196651 A1 | 12/2002 | Weis | |
| 2003/0013272 A1 | 1/2003 | Hong et al. | |
| 2003/0045060 A1 | 3/2003 | Ahn et al. | 438/287 |
| 2003/0045078 A1 | 3/2003 | Ahn et al. | 438/585 |
| 2003/0205729 A1 | 11/2003 | Basceri et al. | 257/200 |
| 2003/0213987 A1 | 11/2003 | Basceri et al. | 257/296 |
| 2003/0219942 A1 | 11/2003 | Choi et al. | 438/253 |
| 2004/0043228 A1 | 3/2004 | Derderian et al. | 428/446 |
| 2004/0046197 A1 | 3/2004 | Basceri et al. | 257/296 |
| 2004/0245559 A1 | 12/2004 | Pontoh et al. | 257/306 |
| 2004/0245560 A1 | 12/2004 | Pontoh et al. | 257/309 |
| 2005/0244571 A1 | 11/2005 | Walheim | |

FOREIGN PATENT DOCUMENTS

| | | |
|---|---|---|
| JP | 2002-323775 | 11/2002 |

OTHER PUBLICATIONS

U.S. Appl. No. 10/609,311, filed Jun. 26, 2003, Yates.

ABSTRACT: Basceri et al., Atomic Layer Deposition for Nanoscale CU Metalization, 10 pages (pre-Apr. 2004).

En et al., Plasma immersion ion implantation reactor design considerations for oxide charging, 85 Surface and Coatings Technology 64-69 (1966).

Ku et al., The Application of Ion Beam Mixing, Doped Silicide, and Rapid Thermal Processing of Self-Aligned Silicide Technology, 137 J. Electrochem. Soc. No. 2, pp. 728-740 (Feb. 1990).

ABSTRACT: How to Eliminate Voiding in Porous-Low-k Dielectrics and The Mechanism of Void Formation; Lin et al.; 4 pages.

COB Stack DRAM Cell Technology beyond 100 nm Technology Node; Yongjik Park & Kinam Kim; pp. 349.1-349.3.

Rubin et al., Shallow-Junction Diode Formation by implantation of Arsenic and Boron Through Titanium-Silicide Films and . . . , 17 IEEE Transactions on Electron Devices, No. 1, pp. 183-190 (Jan. 1990).

U.S. Appl. No. 10/689,958, filed Oct. 2003, Basceri.

U.S. Appl. No. 10/690,029, filed Oct. 2003, Derderian et al.

U.S. Appl. No. 10/882,118, filed Apr. 2004, Sandhu et al.

U.S. Appl. No. 10/879,367, filed Jun. 2004, Blalock et al.

Chang et al., Silicon surface treatments in advanced MOS gate processing, Microelectronic Engineering, (2004), pp. 130-135.

Lemberger et al., Electrical characterization and reliability aspects of zirconium silicate films obtained from novel MOCVD precursors, Microelectronic Engineering (2004), pp. 315-320.

Lu et al., Effects of the $TaN_x$, interface layer on doped tantalum oxide high-k films, VACUUM (2004), pp. 1-9.

Robertson et al., Atomic structure, band offsets, growth and defects at high-K oxide: Si enterfaces, Microelectronic Engineering (2004) pp. 112-120.

Singh et al., High and Low Dielectric Constant Materials, The Electrochemical Society *Interface*, Summer 1999, pp. 26-30.

U.S. Appl. No. 10/932,218, filed Sep. 1, 2004, Basceri et al.

* cited by examiner

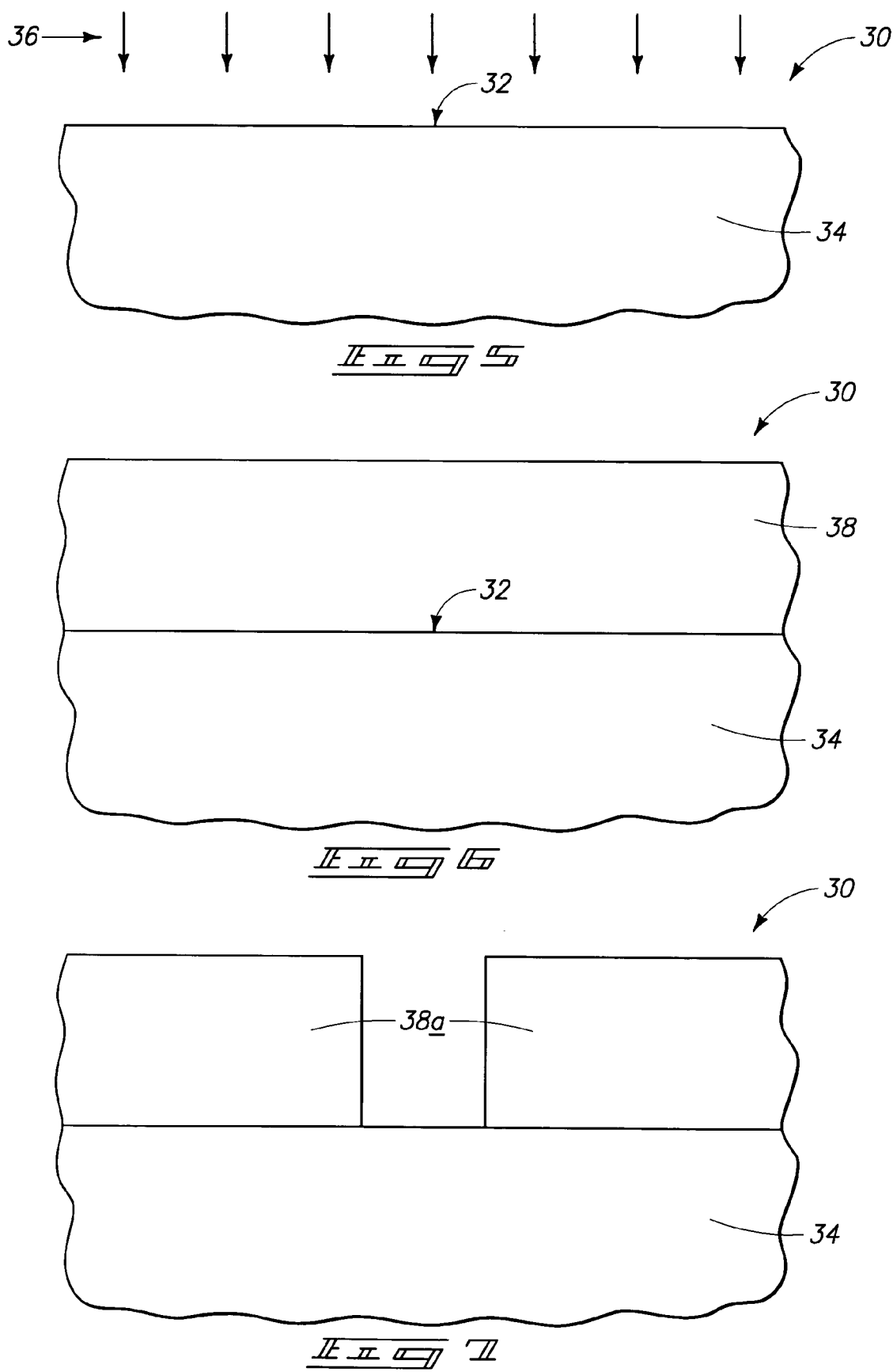

METHODS OF FORMING PATTERNED PHOTORESIST LAYERS OVER SEMICONDUCTOR SUBSTRATES

TECHNICAL FIELD

This invention relates to methods of forming patterned photoresist layers over semiconductor substrates.

BACKGROUND OF THE INVENTION

A continuing goal in semiconductor processing is increased miniaturization while maintaining high performance. Modern semiconductor processes are still heavily reliant on photolithography when fabricating semiconductor circuitry to achieve this goal.

Photolithography is a commonly-used method for patterning features during semiconductor processing. A radiation-sensitive material (i.e., photoresist) is formed over a substrate which is ultimately to be patterned, for example by etching or ion implanting. The photoresist is subsequently subjected to radiation which modifies the solubility of the impacted versus the unimpacted regions in a suitable developer solution. Accordingly, the radiation is provided in a desired pattern so that some portions of the photoresist are impacted by the radiation while other portions of the photoresist are not impacted by the radiation. The photoresist is then subjected to developing conditions which selectively remove either the impacted or the non-impacted portions. Photoresists are typically designed to be either negative or positive. If the photoresist is a positive photoresist, the impacted portions are selectively removed. If the photoresist is a negative photoresist, the non-impacted portions are selectively removed.

The photoresist remaining after development defines a patterned mask. The pattern of such mask can subsequently be transferred to the underlying material using appropriate etching and/or implanting techniques to form patterned features in material beneath the mask. A difficulty which can be encountered during photolithographic processing is that the radiation utilized to pattern the photoresist can be reflected from the underlying layer or layers to cause various constructive and destructive interference patterns to occur. This can adversely affect the pattern ultimately developed in the photoresist.

One manner of addressing the reflective issues is to initially form an antireflective coating over the layer or layers to be patterned, and forming a layer of photoresist thereover. Further, multiple antireflective coating materials or layers might be utilized, as well as multiple layers of resist and/or non-radiation sensitive hard masking or other layers. Various antireflective coating materials have been developed. Some are principally organic in nature, while others are principally inorganic in nature. DARC, which stands for Deposited Antireflective Coating, is typically understood within the industry to define inorganic antireflective coatings formed of silicon, oxygen, nitrogen and sometimes hydrogen. Another commonly used class of antireflective coating is BARC, which stands for Bottom Antireflective Coating. BARC materials are principally organic in nature.

The continuing goal and effect of circuitry miniaturization has typically resulted in greater reduction in the horizontal dimension as opposed to the vertical dimension. In the etching of features, this has resulted in narrower yet correspondingly increasing height in the features being formed, something typically referred to as increasing aspect ratio. Correspondingly, the photoresist masks utilized to form such features typically also have increased aspect ratios. Accordingly, adherence of the photoresist to the underlying antireflective coating or other layers takes on increasing significance towards precluding displacement or toppling of the masking blocks formed in the patterned photoresist. Further and regardless, the photoresist and antireflective coating materials can interact, particularly during a post-exposure bake of the photoresist prior to solvent development. For example, material at the outer surface of the antireflective coating materials can migrate into the photoresist, and/or the photoresist can interact with material on the outer surface of the antireflective coating which can, one or both, adversely affect adherence or desired control in the ultimate pattern produced in the photoresist.

In most instances, it is highly desirable that the photoresist masking blocks which are formed have substantially vertical sidewalls from top to bottom of the photoresist layer. However, the patterned photoresist can tend to flare out at the bottom/bases of the individual masking blocks forming what is commonly referred to as footing. The degree of footing can be exacerbated by use of certain antireflective coatings, principally the result of interaction between the photoresist and outer surface of the antireflective coating.

While the invention was motivated in addressing the above-identified issues, it is in no way so limited. The invention is only limited by the accompanying claims as literally worded, without interpretative or other limiting reference to the specification, and in accordance with the doctrine of equivalents.

SUMMARY

This invention comprises methods of forming patterned photoresist layers over semiconductor substrates. In one implementation, a semiconductor substrate is provided. An antireflective coating is formed over the semiconductor substrate. The antireflective coating has an outer surface. The outer surface is treated with a basic fluid. A positive photoresist is applied onto the outer surface which has been treated with the basic treating fluid. The positive photoresist is patterned and developed effective to form a patterned photoresist layer having increased footing at a base region of said layer than would otherwise occur in the absence of said treating the outer surface.

In one implementation, a method of forming a patterned photoresist layer over a semiconductor substrate includes providing a semiconductor substrate having an outer surface. The outer surface is treated with a basic fluid. Photoresist is applied onto the outer surface which has been treated with the basic treating fluid. The photoresist is patterned and developed to form a patterned photoresist layer.

Other aspects and implementations are contemplated.

BRIEF DESCRIPTION OF THE DRAWINGS

Preferred embodiments of the invention are described below with reference to the following accompanying drawings.

FIG. 5 is a diagrammatic, cross-sectional, fragmentary view of a semiconductor substrate in process in accordance with an aspect of the invention.

FIG. 6 is a view of the FIG. 5 substrate fragment at a processing step subsequent to that shown by FIG. 5.

FIG. 7 is a view of the FIG. 6 substrate fragment at a processing step subsequent to that shown by FIG. 6.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
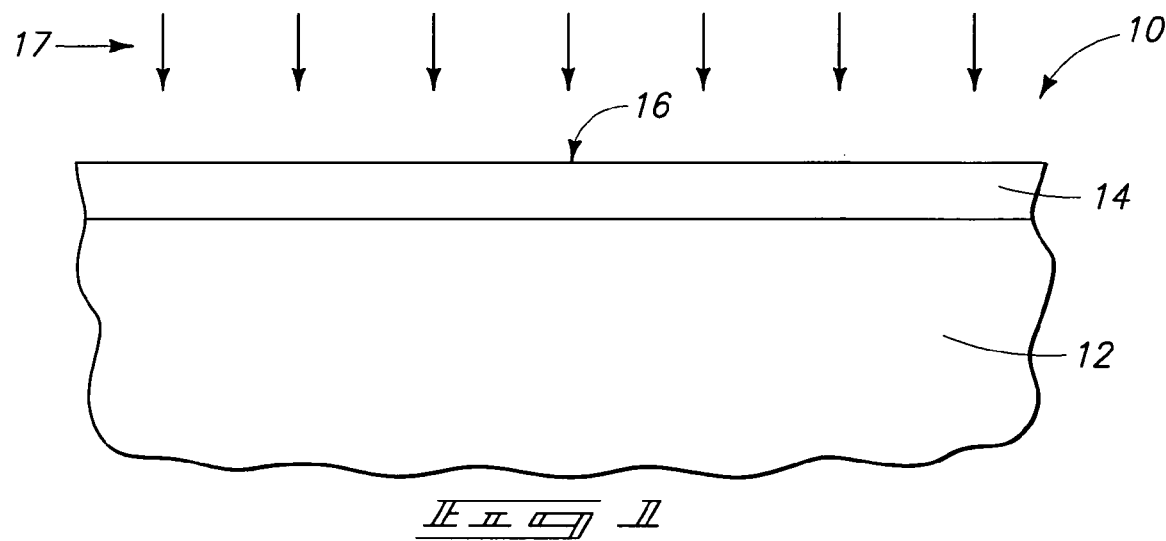
FIG. 1 is a diagrammatic, cross-sectional, fragmentary view of a semiconductor substrate in process in accordance with an aspect of the invention.
Figure 2:
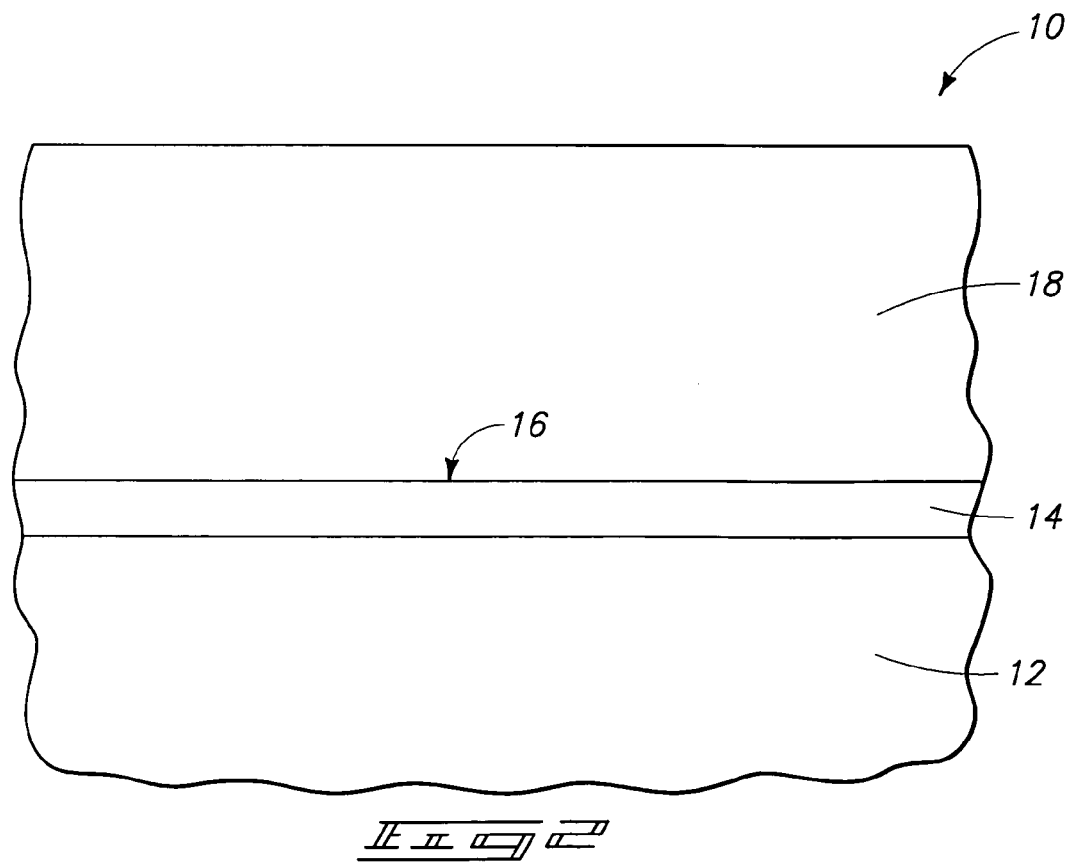
FIG. 2 is a view of the FIG. 1 substrate fragment at a processing step subsequent to that shown by FIG. 1.
Figure 3:
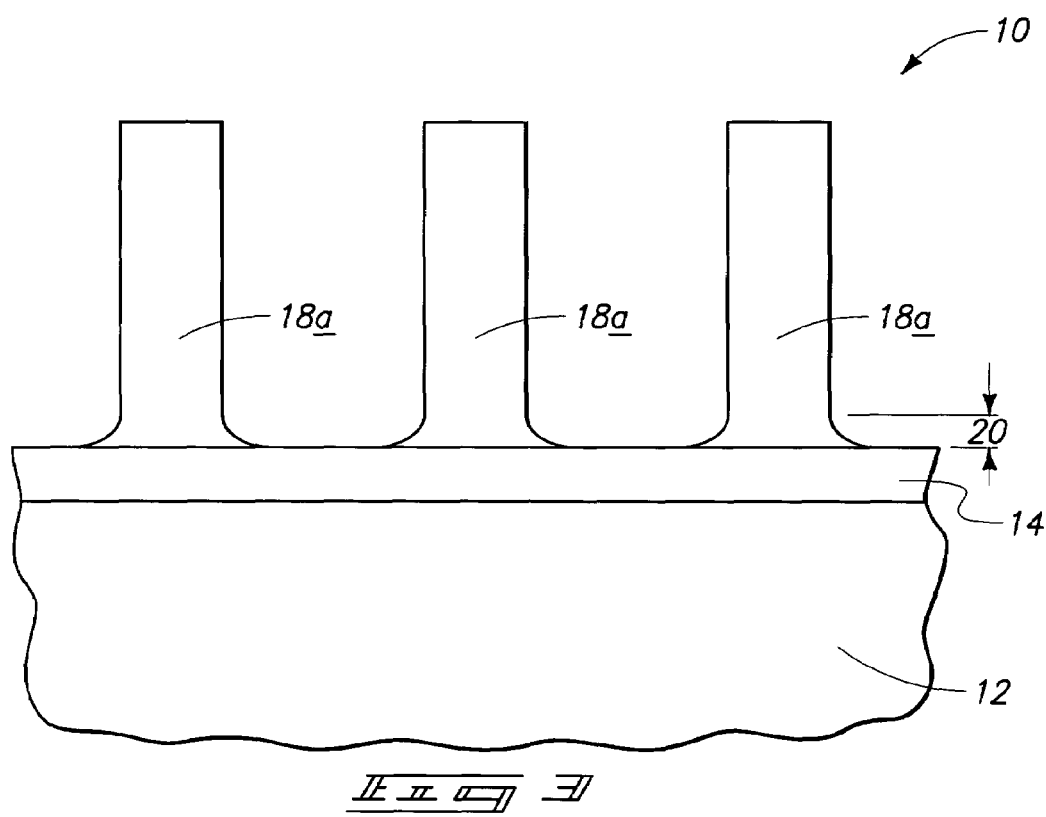
FIG. 3 is a view of the FIG. 2 substrate fragment at a processing step subsequent to that shown by FIG. 2.

A method of forming a patterned photoresist layer over a semiconductor substrate is described initially with reference to an exemplary embodiment as depicted in FIGS. 1–3. Referring initially to FIG. 1, a wafer fragment 10 comprises a semiconductor substrate 12. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Further, the term "layer" encompasses the singular and the plural unless otherwise indicated. Accordingly, semiconductor substrate 12 might comprise multiple different materials and/or layers which may include, by way of example only, bulk semiconductor materials and/or semiconductor-on-insulator layers.

An antireflective coating 14 is deposited over semiconductor substrate 12. Antireflective coating 14 has an outer surface 16. Outer surface 16 could be organic, alternately inorganic, or a combination of organic and inorganic. Exemplary inorganic materials, and by way of example only, include various DARC materials as described above. Exemplary organic materials include the above-described BARCs. The invention was reduced to practice utilizing DongJin A20 BARC available from the DongJin Semiconductor Company, Ltd. of Kyungki-do of South Korea. However, of course, any material for outer surface 16 is contemplated, whether existing or yet-to-be developed.

Outer surface 16 is treated with a basic fluid exemplified by the depicted downwardly directed arrows 17. The basic treating fluid might be liquid, gaseous, or a combination of liquid and gaseous. In the context of this document, a basic treating fluid which is "liquid" or "gaseous" constitutes at least 95% of such phase. Regardless, in one preferred implementation, the basic treating fluid has a pH of at least 8.5, and more preferably a pH of at least 10.5. By way of example only, exemplary preferred basic treating fluids include tetramethyl ammonium hydroxide, potassium hydroxide, sodium hydroxide, ammonium fluoride, and aqueous alkylamine fluids. Specific exemplary alkyl amines include ethylamine, cyclohexylamine, and methylbutylamine. Of course, various combinations or mixtures of the stated, or other materials, might also be employed.

The treating might be conducted under room ambient temperature and room ambient pressure conditions with the basic treating fluid thereat, although temperatures and/or pressures above and/or below room ambient conditions are also of course contemplated. Accordingly, any combination of pressure and temperature might be employed. Any time of treating can be employed, with 2 minutes or less being one preferred example, and 1 minute or less being a more preferred example. Such might be dependent upon pH, treatment pressure, treatment temperature, etc. in conjunction with being effective to obtain some desired objective from the treating.

Referring to FIG. 2, a positive photoresist 18 is applied onto outer surface 16 (meaning in contact therewith) which has been treated with the basic treating fluid. An exemplary, and reduction to practice material was AR360 available from the Shipley Company of Marlborough, Mass. Any desired suitable thicknesses can be utilized for layers 14 and 18. By way of example only, an exemplary thickness range for layer 14 is from 300 Angstroms to 800 Angstroms, with an exemplary thickness range for layer 18 being from 2000 Angstroms to 3350 Angstroms.

Figure 4:
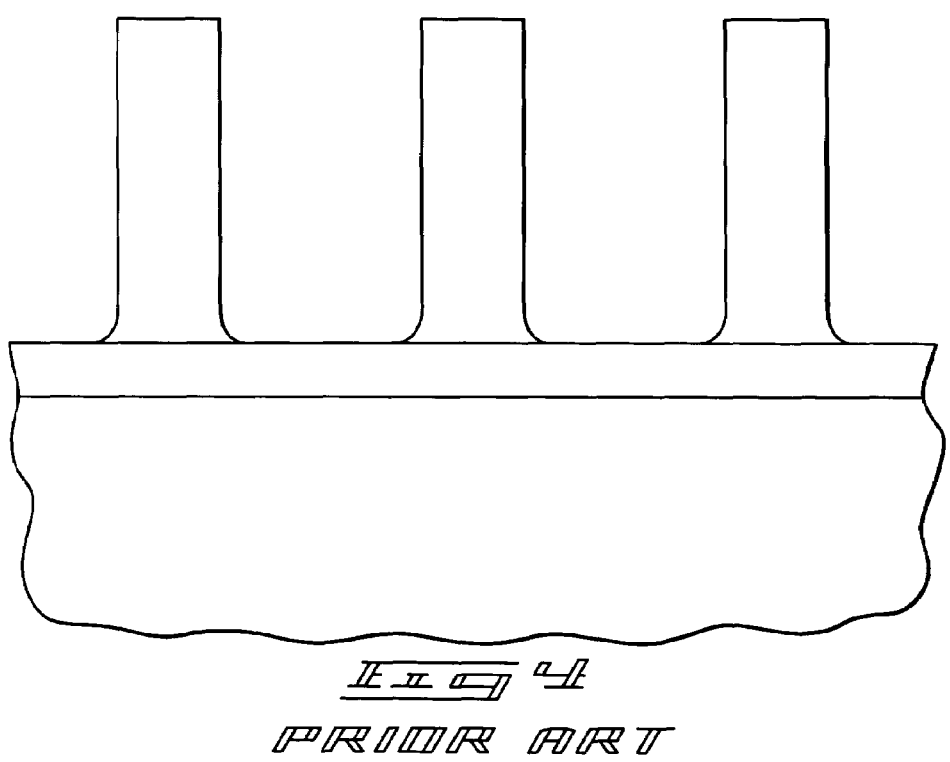
FIG. 4 is a diagrammatic, cross-sectional, fragmentary view of a prior art semiconductor substrate processed in contrast to the FIG. 3 substrate fragment.

Referring to FIG. 3, positive photoresist 18 has been patterned and developed effective to form a patterned photoresist layer 18a. As depicted, layer 18a can be considered as having a base region 20 where the depicted footing commences. In accordance with one aspect of the invention, the, outer surface treating with the basic fluid results in the patterning and developing of the positive photoresist being effective to form the patterned photoresist layer to have increased footing at the base region of said layer than would otherwise occur in the absence of treating the outer surface with a basic fluid. For example, FIG. 4 depicts a prior art construction identical with the FIG. 3 construction and processed in accordance therewith identically but for treating of outer surface 16 of antireflective coating 14 with a basic fluid. FIG. 3 depicts greater degree or increased footing than occurred relative to the FIG. 4 processing.

In one preferred implementation, outer surface 16 is at least partially dried intermediate the basic fluid treating and the application of positive photoresist, and even more preferably completely dried intermediate the treating and photoresist applying. Further preferably in one preferred embodiment, outer surface 16 is not exposed to any liquid intermediate the basic fluid treating and the application of positive photoresist. For example, and preferably, outer surface 16 is allowed to dry under ambient or elevated temperature conditions without any intervening spraying or even rinsing with deionized water over outer surface 16. Alternately but less preferred in an aspect of the invention, the outer surface might be treated with other fluids (for example which may be aqueous, non-aqueous, pH neutral, pH below 7, gaseous, liquid, etc.) intermediate the basic fluid treating and the application of photoresist. Further, outer surface 16 might be treated multiple discrete times with the same or different basic fluids. Regardless, treatment of a surface with a basic fluid prior to photoresist application in accordance with the invention might be for any purpose, including for yet to-be-determined purposes, reasons or objectives. An existing purpose might be to consume known or unknown reactants present on the surface being treated which might otherwise adversely affect some aspect of the subsequent photoresist processing.

The invention was reduced to practice, for example, in conjunction with inventive processing depicted by FIG. 3 relative to a series of control wafers depicted in FIG. 4. The control and inventive wafers were identically processed, but for treatment with a basic fluid to outer surface 16 prior to application of a photoresist layer thereover. The antireflective coating material utilized was the DongJin A20 BARC, with the photoresist being AR360 positive Shipley photoresist. The basic fluid utilized was liquid tetramethyl ammonium hydroxide having a pH of 10.9. Such was puddled atop outer surface 16, with the basic fluid and substrate being at room ambient temperature and pressure conditions. After approximately 60 seconds of such treating, the substrates were spun to substantially expel the liquid from outer surface 16. Such outer surface was then allowed to completely dry in an amine scavenging ambient prior to application of the Shipley A360 photoresist. Upon radiation exposure and develop, the widths of the masking blocks were measured at multiple elevations for determining ratios of a width at the middle illustrated portions of the masking blocks of FIGS. 3 and 4 as compared to the widest portions at the feet of such masking blocks. The control wafers as depicted in FIG. 4 provided an average ratio of foot width to middle width of 1.504, whereas the substrates processed in accordance with the invention had an average ratio of foot width to middle width of 2.060, thereby demonstrating increased degree of footing. Treatment with the basic fluid might enhance adhesion of the photoresist to an antireflective coating, and/or increased footing can result in a greater area of adhesion to an antireflective coating which might be significant in preventing masking blocks with large aspect ratios from toppling.

The invention was principally developed and directed to the issues and substrate constructions for example as generally described above. However, the invention is in no way so limited and may have applicability in other aspects and implementations. For example, processing might occur as described above utilizing an antireflective coating with a basic fluid treatment and independent of whether increased footing occurs as compared to non-basic fluid treated antireflective coating surfaces. Further by way of example only, the invention is applicable to treatment of substrates which do not necessarily have antireflective coatings, and accordingly, might even be highly reflective or transmissive of the incident radiation utilized to pattern the photoresist. Regardless, by way of example only, the treated outer surfaces might comprise silicon oxide materials, for example, boron and/or phosphorous doped silicon dioxide glasses. Alternately by way of example only, the treated outer surfaces might comprise a nitride, such as silicon nitride or titanium nitride. Further, by way of example only, the outer surface might comprise a material such as silicon carbide which has previously been used as a hard masking material in multilayer resist systems.

Further and regardless, the invention has applicability to use with negative photoresists in addition to positive photoresists, and regardless of use of an antireflective coating. FIGS. 5–7 depict an implementation and a method of forming a patterned photoresist layer over a semiconductor substrate in accordance with an aspect of the invention. Referring initially to FIG. 5, a semiconductor substrate 30 has an outer surface 32. Such might comprise an antireflective material, a highly reflective material, or a light transmissive material relative to incident radiation ultimately to be utilized in fabricating a photoresist layer. Further, semiconductor substrate 30 comprises material 34 which may constitute one or more layer or layers of insulative, conductive, and/or semiconductive materials which might be homogenously or non-homogenously distributed. Regardless, outer surface 32 is treated with a basic fluid as depicted by downwardly directed arrows 36. The basic fluid treating is preferably in accordance with any of the attributes described above with respect to the first embodiment, and as claimed herein.

Referring to FIG. 6, photoresist 38 has been applied onto outer surface 32 which has previously been treated with the basic treating fluid. Attributes are preferably as described above, and as claimed herein. Again, reflective, antireflective, or radiation transmissive materials might be utilized above or below layer 38, and layer 38 might constitute one or a combination of positive and/or negative photoresists, as well as other layers which might not be radiation sensitive.

Referring to FIG. 7, photoresist 38 has been patterned and developed to form a patterned photoresist layer 38a. Etching of material beneath layer 38a, or ion implanting or other processing whether existing or yet-to-be developed, could then be conducted through openings formed in layer 38a.

In compliance with the statute, the invention has been described in language more or less specific as to structural and methodical features. It is to be understood, however, that the invention is not limited to the specific features shown and described, since the means wherein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A method of forming a patterned photoresist layer over a semiconductor substrate, comprising:
   providing a semiconductor substrate having an outer surface; the outer surface comprising at least one of a silicon oxide-containing material, an organic-containing material, a silicon nitride-containing material, or a silicon carbide-containing material;
   treating the outer surface with a basic fluid comprising at least one of tetramethyl ammonium hydroxide and ammonium fluoride;
   applying photoresist onto the outer surface which has been treated with the basic treating fluid; and
   patterning and developing the photoresist to form a patterned photoresist layer having laterally projecting feet proximate the semiconductor substrate outer surface.

2. The method of claim 1 wherein the outer surface is organic.

3. The method of claim 1 wherein the outer surface is inorganic.

4. The method of claim 1 wherein the outer surface comprises silicon nitride.

5. The method of claim 1 wherein the outer surface comprises silicon dioxide.

6. The method of claim 1 wherein the outer surface comprises silicon carbide.

7. The method of claim 1 wherein the basic treating fluid has a pH of at least 8.5.

8. The method of claim 1 wherein the basic treating fluid has a pH of at least 10.5.

9. The method of claim 1 wherein the basic treating fluid is liquid.

10. The method of claim 1 wherein the basic treating fluid is gaseous.

11. The method of claim 1 wherein the basic treating fluid comprises tetramethyl ammonium hydroxide.

12. The method of claim 1 wherein the basic treating fluid comprises potassium hydroxide in addition to the at least one of tetramethyl ammonium hydroxide and ammonium fluoride.

13. The method of claim 1 wherein the basic treating fluid comprises sodium hydroxide in addition to the at least one of tetramethyl ammonium hydroxide and ammonium fluoride.

14. The method of claim 1 wherein the basic treating fluid comprises ammonium fluoride.

15. The method of claim 1 wherein the basic treating fluid comprises an alkyl amine in addition to the at least one of tetramethyl ammonium hydroxide and ammonium fluoride.

16. The method of claim 1 wherein the treating is for no more than 2 minutes.

17. The method of claim 1 wherein the treating is for no more than 1 minute.

18. The method of claim 1 wherein the photoresist is a positive photoresist.

19. The method of claim 1 wherein the photoresist is a negative photoresist.

20. The method of claim 1 wherein the outer surface is not exposed to any liquid intermediate the treating and the applying.

21. The method of claim 1 wherein the outer surface is at least partially dried intermediate the treating and the applying.

22. The method of claim 1 wherein the outer surface is completely dried intermediate the treating and the applying.

23. The method of claim 1 wherein,
the outer surface is not exposed to any liquid intermediate the treating and the applying; and
the outer surface is at least partially dried intermediate the treating and the applying.

24. The method of claim 23 wherein the basic treating fluid is liquid.

25. The method of claim 23 wherein the outer surface is completely dried intermediate the treating and the applying.

26. The method of claim 1 wherein the outer surface is reflective of incident radiation used in said patterning of the photoresist.

27. The method of claim 1 wherein the outer surface comprises a silicon oxide-containing material.

28. A method of forming a patterned photoresist layer over a semiconductor substrate, comprising:
providing a semiconductor substrate having an outer surface;
treating the outer surface with a basic fluid, the basic treating fluid being at room ambient temperature and room ambient pressure during the treating;
applying photoresist onto the outer surface which has been treated with the basic treating fluid; and
patterning and developing the photoresist to form a patterned photoresist layer.

29. A method of forming a patterned photoresist layer over a semiconductor substrate, comprising:
providing a semiconductor substrate having an outer surface; the outer surface comprising at least one of a silicon oxide-containing material, an organic-containing material, a silicon nitride-containing material, or a silicon carbide-containing material;
treating the outer surface with a basic fluid comprising at least one of tetramethyl ammonium hydroxide and ammonium fluoride;
applying a positive photoresist onto the outer surface which has been treated with the basic treating fluid; and
patterning and developing the positive photoresist effective to form a patterned photoresist layer having increased footing at a base region of said layer than would otherwise occur in the absence of said treating the outer surface.

30. The method of claim 29 wherein the outer surface is not exposed to any liquid intermediate the treating and the applying.

31. The method of claim 29 wherein the outer surface is at least partially dried intermediate the treating and the applying.

32. The method of claim 29 wherein the outer surface is completely dried intermediate the treating and the applying.

33. The method of claim 29 wherein,
the outer surface is not exposed to any liquid intermediate the treating and the applying; and
the outer surface is at least partially dried intermediate the treating and the applying.

34. The method of claim 33 wherein the basic treating fluid is liquid.

35. The method of claim 33 wherein the outer surface is completely dried intermediate the treating and the applying.

36. The method of claim 29 wherein the outer surface is organic.

37. The method of claim 29 wherein the outer surface is inorganic.

38. The method of claim 29 wherein the outer surface comprises silicon nitride.

39. The method of claim 29 wherein the outer surface comprises silicon dioxide.

40. The method of claim 29 wherein the outer surface comprises silicon carbide.

41. The method of claim 29 wherein the basic treating fluid has a pH of at least 8.5.

42. The method of claim 29 wherein the basic treating fluid has a pH of at least 10.5.

43. The method of claim 29 wherein the basic treating fluid is liquid.

44. The method of claim 29 wherein the basic treating fluid is gaseous.

45. The method of claim 29 wherein the basic treating fluid comprises tetramethyl ammonium hydroxide.

46. The method of claim 1 wherein the basic treating fluid comprises potassium hydroxide in addition to the at least one of tetramethyl ammonium hydroxide and ammonium fluoride.

47. The method of claim 1 wherein the basic treating fluid comprises sodium hydroxide in addition to the at least one of tetramethyl ammonium hydroxide and ammonium fluoride.

48. The method of claim 29 wherein the basic treating fluid comprises ammonium fluoride.

49. The method of claim 1 wherein the basic treating fluid comprises an alkyl amine in addition to the at least one of tetramethyl ammonium hydroxide and ammonium fluoride.

50. The method of claim 29 wherein the outer surface is reflective of incident radiation used in said patterning of the photoresist.

51. The method of claim 29 wherein the outer surface comprises a silicon oxide-containing material.

52. A method of forming a patterned photoresist layer over a semiconductor substrate, comprising:
providing a semiconductor substrate having an outer surface;
treating the outer surface with a basic fluid, the basic treating fluid being at room ambient temperature and room ambient pressure during the treating;
applying a positive photoresist onto the outer surface which has been treated with the basic treating fluid; and
patterning and developing the positive photoresist effective to form a patterned photoresist layer having increased footing at a base region of said layer than would otherwise occur in the absence of said treating the outer surface.

53. A method of forming a patterned photoresist layer over a semiconductor substrate, comprising:
   providing a semiconductor substrate;
   depositing an antireflective coating over the semiconductor substrate,
   the antireflective coating having an outer surface; the outer surface comprising at least one of a silicon oxide-containing material, an organic-containing material, a silicon nitride-containing material, or a silicon carbide-containing material;
   treating the outer surface with a basic fluid comprising at least one of tetramethyl ammonium hydroxide and ammonium fluoride;
   applying a positive photoresist onto the outer surface which has been treated with the basic treating fluid; and
   patterning and developing the positive photoresist effective to form a patterned photoresist layer having increased footing at a base region of said layer than would otherwise occur in the absence of said treating the outer surface.

54. The method of claim 53 wherein the outer surface is not exposed to any liquid intermediate the treating and the applying.

55. The method of claim 53 wherein the outer surface is at least partially dried intermediate the treating and the applying.

56. The method of claim 53 wherein the outer surface is completely dried intermediate the treating and the applying.

57. The method of claim 53 wherein,
   the outer surface is not exposed to any liquid intermediate the treating and the applying; and
   the outer surface is at least partially dried intermediate the treating and the applying.

58. The method of claim 57 wherein the basic treating fluid is liquid.

59. The method of claim 57 wherein the outer surface is completely dried intermediate the treating and the applying.

60. The method of claim 53 wherein the outer surface is organic.

61. The method of claim 53 wherein the outer surface is inorganic.

62. The method of claim 53 wherein the basic treating fluid has a pH of at least 8.5.

63. The method of claim 53 wherein the basic treating fluid has a pH of at least 10.5.

64. The method of claim 53 wherein the basic treating fluid is liquid.

65. The method of claim 53 wherein the basic treating fluid is gaseous.

66. The method of claim 53 wherein the basic treating fluid comprises tetramethyl ammonium hydroxide.

67. The method of claim 1 wherein the basic treating fluid comprises potassium hydroxide in addition to the at least one of tetramethyl ammonium hydroxide and ammonium fluoride.

68. The method of claim 1 wherein the basic treating fluid comprises sodium hydroxide in addition to the at least one of tetramethyl ammonium hydroxide and ammonium fluoride.

69. The method of claim 53 wherein the basic treating fluid comprises ammonium fluoride.

70. The method of claim 1 wherein the basic treating fluid comprises an alkyl amine in addition to the at least one of tetramethyl ammonium hydroxide and ammonium fluoride.

71. The method of claim 53 wherein the outer surface comprises a silicon oxide-containing material.

72. The method of claim 53 wherein the outer surface comprises an organic-containing material.

73. The method of claim 53 wherein the outer surface comprises a silicon nitride-containing material.

74. The method of claim 53 wherein the outer surface comprises a silicon carbide-containing material.

75. A method of forming a patterned photoresist layer over a semiconductor substrate, comprising:
   providing a semiconductor substrate;
   depositing an antireflective coating over the semiconductor substrate,
   the antireflective coating having an outer surface;
   treating the outer surface with a basic fluid, the basic treating fluid being at room ambient temperature and room ambient pressure during the treating;
   applying a positive photoresist onto the outer surface which has been treated with the basic treating fluid; and
   patterning and developing the positive photoresist effective to form a patterned photoresist layer having increased footing at a base region of said layer than would otherwise occur in the absence of said treating the outer surface.

* * * * *

UNITED STATES PATENT AND TRADEMARK OFFICE
CERTIFICATE OF CORRECTION

PATENT NO.        : 7,115,532 B2                                    Page 1 of 1
APPLICATION NO.   : 10/655997
DATED             : October 3, 2006
INVENTOR(S)       : Daley It is certified that error appears in the above-identified patent and that said Letters Patent is hereby corrected as shown below:

Title Page, Item (73) Assignee:, please delete "Technolgoy" after "Micron" and insert --Technology--.

Title Page 2, Item (56) OTHER PUBLICATIONS, please delete "10/882,118" after "No." and insert --10/822,118--.

Col. 4, line 26, please delete "the, outer" before "surface" and insert --the outer--.

Col. 6, line 21, please delete "wherein" after "means" and insert --herein--.

Col. 8, line 38, claim 46, please delete "1" after "claim" and insert --29--.

Col. 8, line 42, claim 47, please delete "1" after "claim" and insert --29--.

Col. 8, line 48, claim 49, please delete "1" after "claim" and insert --29--.

Signed and Sealed this

Second Day of October, 2007

JON W. DUDAS
*Director of the United States Patent and Trademark Office*